(12) United States Patent
Mokalla

(10) Patent No.: US 9,584,069 B1
(45) Date of Patent: Feb. 28, 2017

(54) BODY DRIVEN POWER AMPLIFIER LINEARIZATION

(71) Applicant: TriQuint Semiconductor, Inc., Hillsboro, OR (US)

(72) Inventor: Mehra Mokalla, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 4 days.

(21) Appl. No.: 14/641,224

(22) Filed: Mar. 6, 2015

(51) Int. Cl.
H03F 3/16 (2006.01)
H03F 1/02 (2006.01)
H03F 3/193 (2006.01)
H03F 3/21 (2006.01)

(52) U.S. Cl.
CPC .......... *H03F 1/0205* (2013.01); *H03F 3/193* (2013.01); *H03F 3/21* (2013.01); *H03F 2200/451* (2013.01)

(58) Field of Classification Search
CPC ............... H03F 1/22; H03F 1/223; H03F 3/16
USPC ......................................... 330/277, 296, 311
See application file for complete search history.

(56) References Cited

U.S. PATENT DOCUMENTS

| 3,166,719 | A | 1/1965 | Wiencek | |
|---|---|---|---|---|
| 6,229,405 | B1* | 5/2001 | Hashimoto | H03K 3/012 326/121 |
| 2009/0251213 | A1* | 10/2009 | Mangudi | G05F 3/205 330/253 |
| 2012/0056673 | A1* | 3/2012 | Boor | H03F 3/505 330/277 |
| 2012/0064852 | A1* | 3/2012 | Lee | H03F 1/0261 455/341 |

OTHER PUBLICATIONS

Sowlati, Tirdad, "A 2.4-GHz 0.18-um CMOS Self-Biased Cascode Power Amplifier", IEEE Journal of Solid-State Circuits, vol. 38, No. 8, Aug. 2003.

* cited by examiner

*Primary Examiner* — Steven J Mottola
(74) *Attorney, Agent, or Firm* — Withrow & Terranova, P.L.L.C.

(57) ABSTRACT

Embodiments include an apparatus, system, and method related to a body driven field effect transistor (FET). In embodiments, a body terminal of the FET may be electrically coupled with a source terminal of a second FET, and a drain terminal of the FET may be electrically coupled with a drain terminal of the second FET. Other embodiments may be described.

18 Claims, 10 Drawing Sheets

BODY DRIVEN POWER AMPLIFIER LINEARIZATION

FIELD

Embodiments of the present disclosure relate generally to the field of circuits, and more particularly to field effect transistors (FETs).

BACKGROUND

A power amplifier (PA) such as a complementary metal-oxide-semiconductor (CMOS)-based PA may offer cost benefits, and lend itself well for monolithic integration of analog and digital circuits. Specifically, competing heterojunction bipolar transistor (HBT) and gallium arsenide (GaAs) technologies may cost more to implement per given area than a CMOS-based PA, and may not be well suited for digital and complex analog control circuits. Specifically, in HBT and GaAs PA technologies, CMOS die are often used only for digital and analog control. However, the introduction of the CMOS die to the HBT or GaAs PA may end up increasing the cost of the PA that includes the CMOS die due to extra assembly steps required to make the PA. Additionally, this mixed technology may provide practical limits on input and outputs (I/Os) and may limit the complexity of control functions. Additionally, the overall linearity and power-added efficiency (PAE) of CMOS PAs may not match that of GaAs HBT PAs.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION

Figure 1:
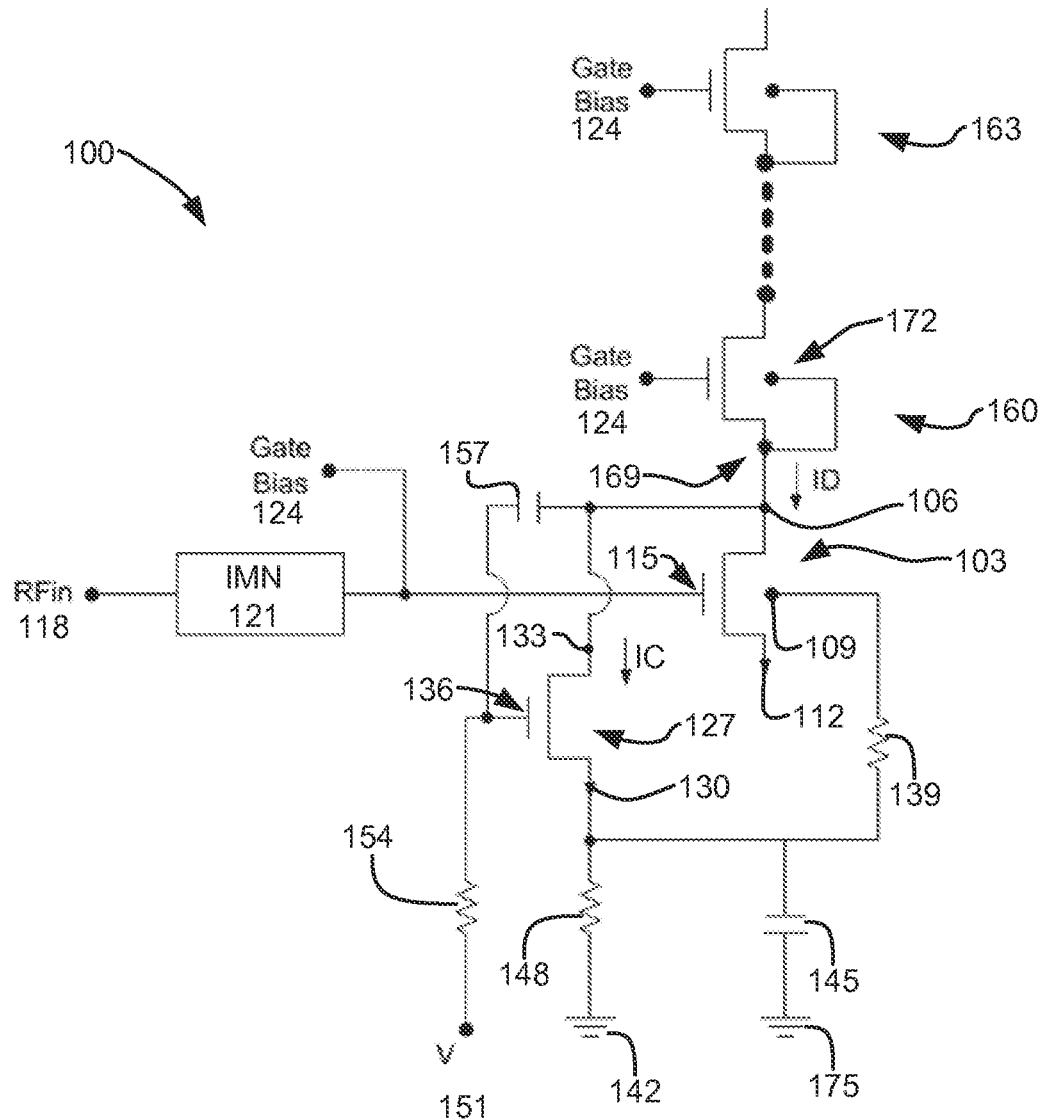
FIG. 1 illustrates an example circuit, in accordance with various embodiments.

Embodiments include an apparatus, system, and method related to a body driven FET. In embodiments, a body terminal of the FET may be electrically coupled with a source terminal of a second FET, and a drain terminal of the FET may be electrically coupled with a drain terminal of the second FET. Other embodiments may be described.

In embodiments, the disclosure may increase the linear power and efficiency of the FET. A typical 2 decibel (dB) increase in linear power and 6% improvement in power-added efficiency may be achieved in embodiments of this disclosure.

The circuit described herein may operate by making corrections as a function of output power to a body voltage of the FET to improve AM-AM and AM-PM distortion as described in detail below. Dynamic bias changes may be made to the RF transistor bias of the FET to increase current, which may avoid compression of the FET as RF power is increased by controlling the body terminal of the FET.

In embodiments of the disclosure, the second FET may be used to lower the saturation voltage or knee region of the voltage between the drain terminal and source terminal ($V_{DS}$) of the first FET as the RF output power increases, while also making dynamic bias adjustments. Generally, the threshold voltage ($V_T$) of the first FET may be decreased as RF power to the first FET is increased. This change in $V_T$ may simultaneously increase current and lower the saturation voltage or knee region of $V_{DS}$ when higher output powers are used. Additionally, embodiments of the disclosure may change the body voltage of the FET to achieve bias control and $V_T$ modulation to lower the minimum allowable $V_{DS}$ excursions.

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "A/B" and "A and/or B" mean (A), (B), or (A and B); and the phrase "A, B, and/or C" means (A), (B), (C), (A and B), (A and C), (B and C) or (A, B and C).

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

As used herein, "electrically coupled" may mean that two elements are able to transfer one or more electrical signals between one another. However, unless indicated otherwise, two elements may be electrically coupled without being directly physically coupled to one another. In some embodiments, one or more additional electrical circuit components (i.e., a resistor, a capacitor, or some other component) may be electrically between two components that are considered to be "electrically coupled."

Generally, for modulated signals, PA linearity may correlate to amplitude/amplitude (AM-AM) and amplitude/phase (AM-PM) characteristics of the PA. AM-AM characteristics and AM-PM characteristics may refer to the transformation of input amplitude variations of a FET into variations of the output amplitude and phase of the FET, respectively. For an ideal PA, input variations will result in a constant or near-constant (amplification factor) output variation and a constant or near-constant phase delay of the FET, regardless of input power to the FET. Specifically, AM-AM distortion may refer to the PA characteristic wherein PA output power deviates from the expected constant amplification factor as PA input power increases. AM-AM distortion may generally be attributed to or related to a phenomenon which may be known as PA saturation or compression.

AM-PM distortion may refer to the change of output phase of the FET as the PA input power to the FET is increased. AM-PM distortion may be related to a phenomenon wherein a PA phase response of a FET may be non-constant due to internal device capacitance change as power is changed. In some cases, reducing AM-AM and AM-PM distortion of a PA may improve linearity performance of the PA. This disclosure relates to dynamically biasing the body of a silicon on insulator (SOI) field effect transistor (FET), and specifically an SOI metal-oxide-semiconductor FET (MOSFET) to minimize AM-AM and AM-PM distortion as RF power of the FET is increased.

In embodiments, the body bias of the RF power FET may change as a function of output power to significantly correct for nonlinearities while maintaining or improving efficiency as compared to a similar RF power set that is not using the same technique. Specifically, as output power is increased, the average DC voltage of the body terminal of the RF power FET may increase with respect to the source terminal of the RF power FET, which in turn may increase the current and operating point of the RF power FET to prevent compression. Generally, the drain current of a FET may be defined by:

$$I_D = \beta(V_{GS} - V_{TB})^2(1 + \lambda V_{DS}) \quad \text{(Equation 1)}$$

$$\beta = \frac{\mu C_{ox} * W}{2L} \quad \text{(Equation 2)}$$

$$V_{TB} = V_{TO} + \gamma(\sqrt{V_{SB} + 2\varphi} - \sqrt{2\varphi}) \approx V_{TO} + \frac{\gamma}{2\sqrt{2\varphi}} V_{SB} = \quad \text{(Equation 3)}$$

$$V_{TO} - \propto V_{BS}$$

Where λ may refer to an early effect or channel length modulation coefficient of the FET; $V_{TB}$ may refer to a threshold voltage of the FET at a body to source bias point; $V_{BS}$ may refer to a body to source voltage of the FET; $V_{DS}$ may refer to a drain to source voltage of the FET; $V_{AS}$ may refer to a gate to source voltage of the FET; $V_{TO}$ may refer to a threshold voltage of the FET at zero source body voltage; γ may refer to a body effect parameter of the FET; 2φ may refer to a surface body potential of the FET at zero source body voltage; and ∝ may be equal to $$\frac{\gamma}{2\sqrt{2\varphi}}.$$

Further, Cox may refer to a gate oxide process parameter of the FET, W may refer to width of the gate of the FET, and L may refer to length of the gate of the FET.

As can be seen from the above equations, as $V_{BS}$ is increased, $V_{TB}$ may be decreased. From equation 1, it can also be noted that with all the other parameters constant except for $V_{TB}$, drain current ($I_D$) may increase as $V_{TB}$ decreases. Therefore, modulating the body of the FET to the source of the FET may dynamically increase or decrease current going through the FET as needed. Specifically, at higher power levels, $V_{TB}$ may decrease, which may result in extra current and power going through the FET. Conversely, at low power levels, $V_{TB}$ may increase, which may result in less current and/or power flowing through the FET.

At low power levels, efficiency of the RF power FET may be maintained, because the average body voltage ($V_{body}$) of the FET, which may affect the power consumed by the FET, may be low. However, at higher power levels, the body voltage of that RF power FET may be increased. A circuit that quickly responds to RF power changes of the FET to maintain linearity in non-constant envelope conditions may therefore be desirable. An example of such a circuit 100 is depicted in FIG. 1.

The circuit 100 may include a main RF power FET 103. The FET 103 may include a drain terminal 106, body terminal 109, source terminal 112, and gate terminal 115. In embodiments, the source terminal 112 may be coupled with ground. The gate terminal 115 of the FET 103 may be coupled with an RF input 118. In some embodiments, an input matching network (IMN) 121 may be positioned between the RF input 118 and gate terminal 115. In embodiments, the gate terminal 115 may further be coupled with a gate bias 124.

The circuit 100 may further include FET 127. The FET 127 may include a drain terminal 133, a source terminal 130, and gate terminal 136. In embodiments, the body terminal 109 of the FET 103 may be coupled with the source terminal 130 of FET 127. In some embodiments, a resistor 139 may be placed between the body terminal 109 and the source terminal 130. The resistor 139 may be on the order of 10 to 10000 ohms. Additionally, as shown in FIG. 1, drain terminal 106 may be coupled with drain terminal 133.

In some embodiments, the source terminal 130 and the body terminal 109 may be coupled with ground 142, and in some embodiments a resistor 148 may be placed between ground 142 and the source terminal 130/body terminal 109. In embodiments, the resistor 148 may be on the order of 10 to 10000 ohms.

Additionally, in some embodiments, the source terminal 130 and the body terminal 109 may be coupled with ground 175, and in some embodiments a capacitor 145 may be placed between ground 175 and the source terminal 130/body terminal 109. In embodiments, the capacitor 145 may be on the order of 1 pico to 1 micro Farad.

In some embodiments, the gate terminal 136 may be coupled with drain terminals 133 and 106, as shown in FIG.

1. In embodiments, a capacitor 157 may be positioned between the gate terminal 136 and the drain terminals 133 and 106. The capacitor 157 may be on the order of 1 to 100 pico Farad.

In some embodiments, the gate terminal 136, drain terminal 133, and drain terminal 106 may further be coupled with a voltage source 151. In some embodiments, a resistor 154 may be positioned between the voltage source 151, and the gate terminal 136/drain terminal 133/drain terminal 106 as shown in FIG. 1. The resistor 148 may be on the order of 100 to 10000 ohms.

In embodiments, the values of resistors 139, 148, 154 may be dependent on one or more factors that are related to device size and/or application. For example, the value of resistor 139 may be dependent on a physical size of FET 103, and/or the frequency or frequency range of the RF signal being propagated through circuit 100.

Similarly, the values of capacitors 145 and/or 157 may be generally related to or based on one or more factors such as device size and/or application. For example, if the circuit 100 is being used in a PA that is being used primarily for relatively low frequency RF applications, then the value of capacitor 145 may be on the order of approximately 1 micro Farad, and the value of capacitor 157 may be on the order of approximately 100 pico Farads. By contrast, if the circuit 100 is being used in a PA that is being used primarily for relatively high frequency RF applications, then the value of capacitor 145 may be on the order of approximately 1 pico Farad, and the value of capacitor 157 may be on the order of approximately 1 pico Farad.

In some embodiments, the circuit 100 may optionally include additional RF power FETs such as FETs 160 and 163. In some embodiments, the FETs 160 and 163 may further be coupled with the gate bias 124. In some embodiments, the body terminal 172 of the additional FETs may be coupled with the source terminal 169 of the additional FETs, such as shown with FET 160. In some embodiments, the gate bias may be different for one or more of FETs 103, 163, and 160 than another one of FETs 103, 163, and 160.

In embodiments, the RF output of the circuit 100 may be or be coupled with the drain terminal of one or more of FETs 103, 163, or 160. Specifically, as shown in FIG. 1, the RF output of the circuit 100 may be or may be coupled with the FET 103, 163, or 160 that is closest to the "top" of the circuit 100 as depicted in FIG. 1. For example, if circuit 100 only includes FET 103, then the RF output of the circuit 100 may be or be coupled with drain terminal 106. If the circuit 100 includes FETs 103 and 160, then the RF output of the circuit 100 may be or be coupled with the drain terminal of FET 160. Similarly, if the circuit 100 includes FETs 103, 160, and 163, then the RF output of the circuit 100 may be or be coupled with the drain terminal of FET 163. In other embodiments, the RF output of the circuit 100 may be coupled with the circuit at different points or terminals.

It will be understood the circuit 100 is depicted merely as one example of an embodiment of the present disclosure. In some embodiments, circuit 100 may have additional or omitted items than shown in FIG. 1. For example, in some embodiments capacitor 145 and/or resistor 139 may be omitted. In other embodiments one or more of FETs 160 or 163 may be omitted, while in other embodiments additional FETs may be included.

As shown in FIG. 1, $I_D$, the drain current, may originate from the drain terminal 106 of FET 103. In some embodiments, the drain current may be supplied from one or more of FETs 160 and 163. The drain current may increase the power handling capability of the circuit 100, limited by the breakdown voltages of the FETs 103 and/or 160, and 163, as explained in further detail below.

The circuit 100 may operate according to one or more of the following principles. Specifically, the increasing body voltage of FET 103 with the increasing power may dynamically lower the saturation region of $V_{DS}$, and enable the FET 103 to operate with lower $V_{DS}$ headroom without shutting off as RF power is increased. This lowered saturation region of $V_{DS}$ may allow for extended range of gain compensation correction to avoid AM-AM nonlinearity. Specifically, the saturation region for FET 103 may be defined as $V_{GS} > V_T$, and $V_{DS}$ ($V_{GS} - V_T$), where $V_{GS}$ is the voltage between the gate terminal 115 and the source terminal 112 of the FET 103, $V_{DS}$ is the voltage between the drain terminal 106 and the source terminal 112 of the FET 103, and $V_T$ is a threshold voltage. In embodiments, by dynamically lowering $V_T$ through body modulation, the FET 103 may operate at a lower $V_{DS}$ without entering the triode region, as depicted in greater detail with respect to FIGS. 7 and 8, below, and hence AM-AM performance may be extended to higher power levels that induce lower $V_{DS}$ excursions. Although a similar approach may be possible by a gate modulation to increase the bias, gate modulation may not be as effective since the RF transistor voltage threshold may not change to support lower $V_{DS}$ excursions. This disclosure, in contrast, may differentiate itself by changing the body voltage of FET 103 to achieve bias controlling voltage special modulation to lower the minimum allowable $V_{DS}$ excursions.

$C_{gs}$ of the RF power FET 103 may contribute to AM-PM variation, and changes significantly as the FET 103 goes from the saturation mode of operation to the triode or linear region. Specifically, $C_{gs}$ may be defined as approximately half of Cox*W*L for the triode mode (Equation 4) and approximately two thirds of Cox*W*L for the saturated mode (Equation 5), wherein Cox, W, and L are as described above. Although the FET 103 may work in the saturation region mainly at peak power excursions $V_{DS}$ may drop and the triode region may be approached or entered, which may reduce $C_{gs}$.

The equations 4 and 5 indicate approximate values for $C_{gs}$ in different modes of operation that may approximate the extremes of the signal swing due to operation of circuit 100. Generally, $C_{gs}$ may not change spontaneously between the two cases, and there may be $C_{gs}$ reduction even before the triode or linear region is fully reached. Again, dynamically changing the body voltage of the FET 103 to increase as power to the FET 103 is increased may minimize $C_{gs}$ change due to the FET 103 entering or approaching the linear region and AM-PM changes extend to higher RF drive power levels. With the delayed onset of AM-PM variation, improved linearity may be achieved via extended output power levels.

Figure 2:
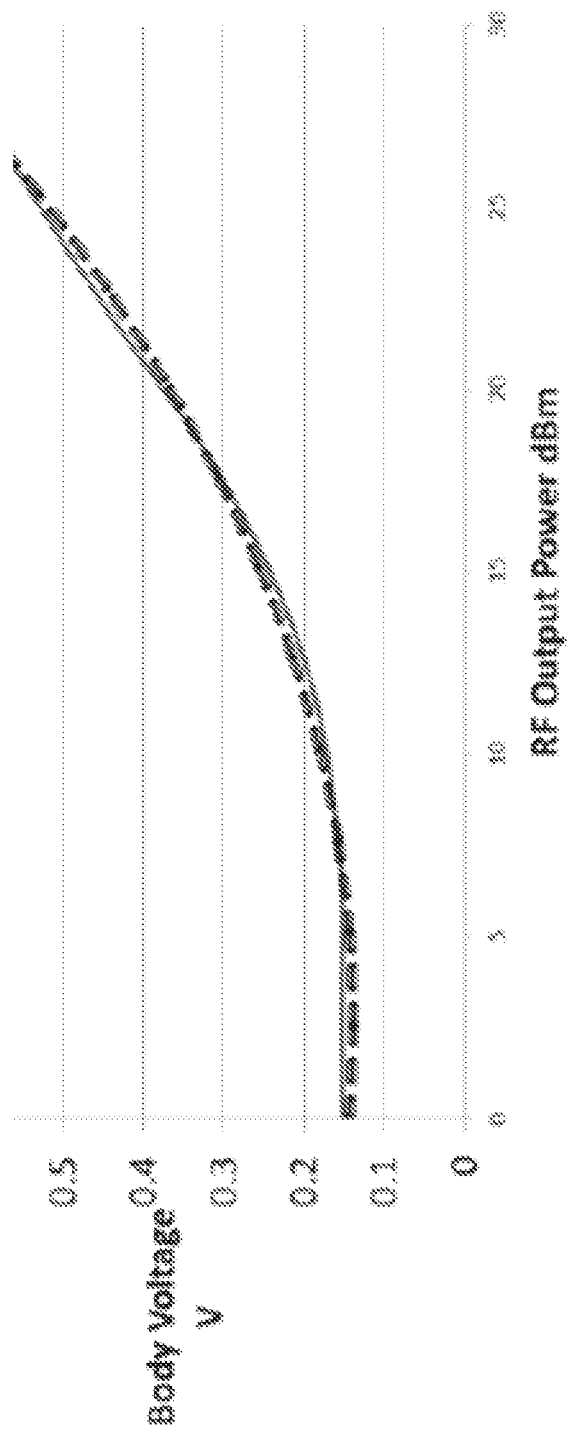
FIG. 2 depicts an example of correction voltage versus a modeled third order polynomial, in accordance with various embodiments.

In embodiments, the correction voltage is applied to the body terminal 109 of the FET 103 as a function of output power that may be empirically extracted, and a third order polynomial function of the form $V_{body} = k_b + a_b x + b_b x^2 + c_b x^3$ (Equation 6) may be considered a reasonable fit for the correction voltage. Specifically, FIG. 2 depicts an example of correction voltage versus a modeled third order polynomial described by equation 6. Specifically, the solid line depicts an example body voltage of the FET 103, wherein the dashed line depicts an example modeled third order polynomial.

In equation 6, the term $k_b$ may be a static constant; $a_b$, $b_b$, and $c_b$ may be coefficients of the equation; and x may be the output power level. Generally, it may be desirable for the body voltage to follow the third order polynomial for improved performance of the FET 103. The third order polynomial function may increase the body voltage at body terminal 109 adequately as a function of output power to avoid compression of the FET 103 without overcompensation.

The third order polynomial equation could be implemented with a power detector and log amps that are able to respond quickly to changes in the circuit; however, doing so could add complexity and cost and increase power consumption of the circuit 100. By contrast, the circuit 100 depicts an efficient implementation that utilizes the drain current of the FET 103 to generate the body driving voltage needed, thereby eliminating the overhead of detectors and log amps. To improve efficiency, FETs such as FETs 103, 160, and 163 may be biased in class AB. A nonlinearized FET's current bias in class AB may be modeled by a third order polynomial such as $I_d = k_d + a_d x + b_d x^2 + c_d x^3$ (Equation 7) where $I_d$ may be the drain current as described above; $k_d$ may be static constant; $a_d$, $b_d$, and $c_d$ may be coefficients; and x may be the output power level of the FET 103.

Figure 3:
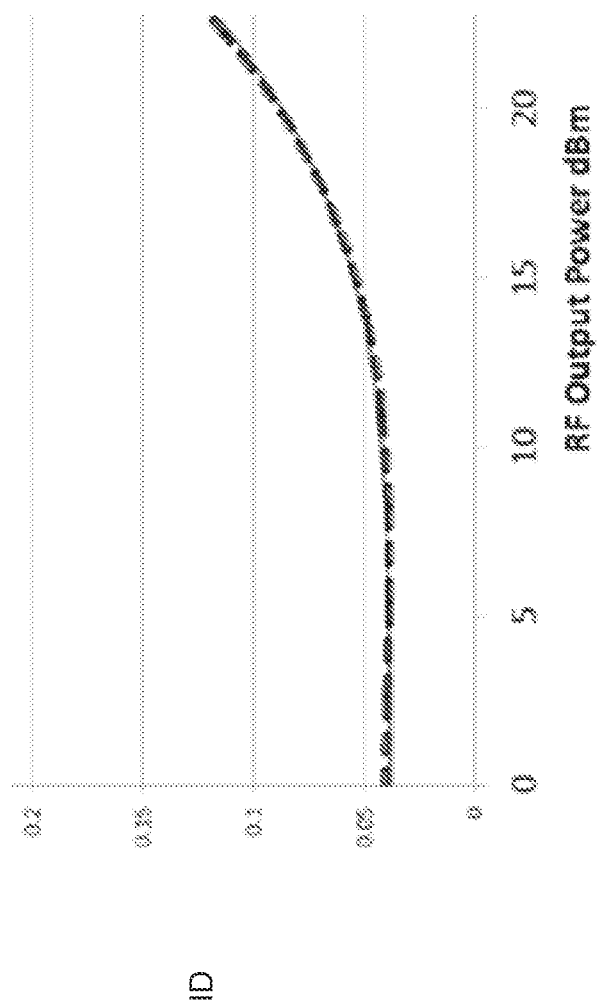
FIG. 3 illustrates an example of drain current versus output power of a circuit, in accordance with various embodiments.

As described above, the third order polynomial behavior of a representative nonlinearized FET drain current may be modeled by a third order polynomial as shown in the example depicted in FIG. 3. Specifically, in FIG. 3, the solid line depicts an example drain current flowing through FET 103, where the dashed line depicts an example modeled third order polynomial described by equation 7.

Figure 4:
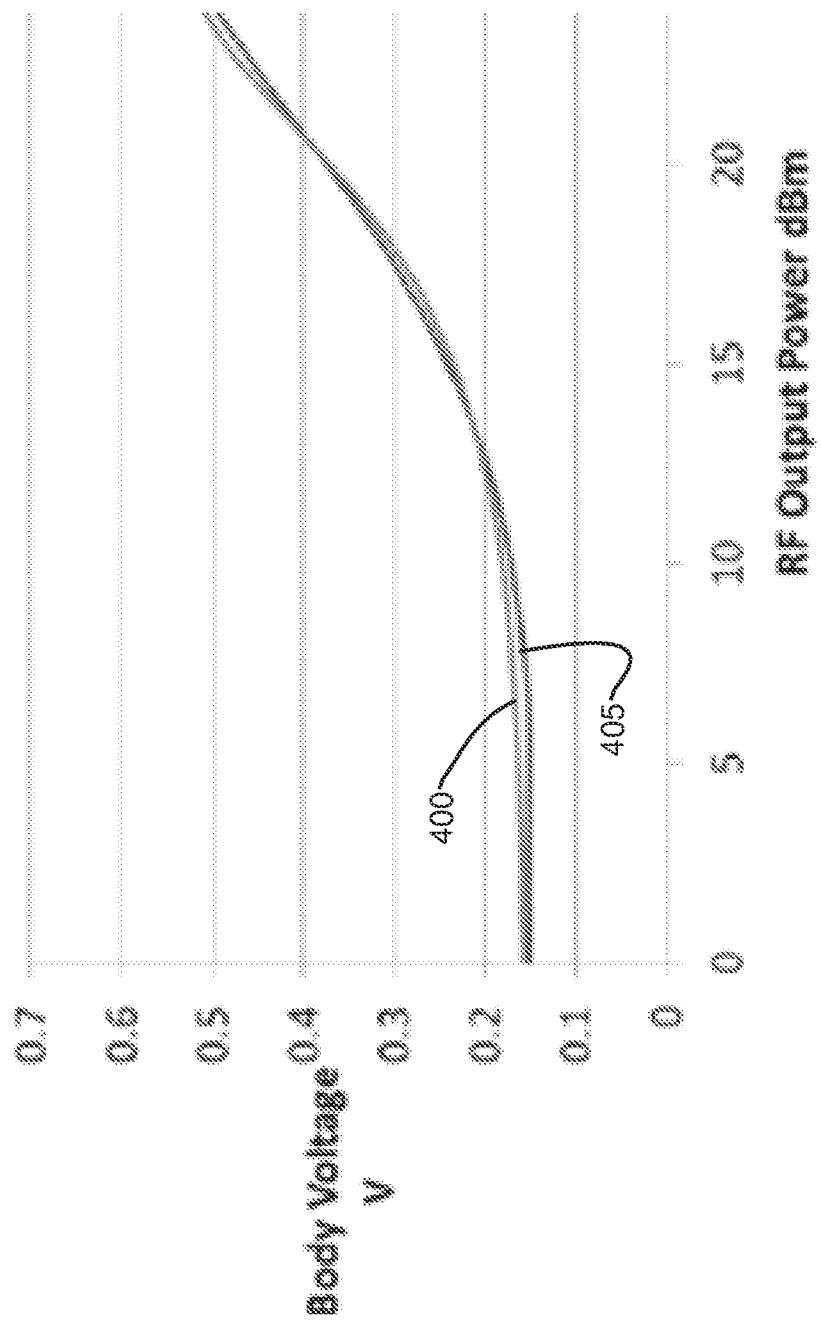
FIG. 4 depicts an example comparison of a body voltage drive to an ideal body voltage target, in accordance with various embodiments.

From equation 6 and equation 7, it may be readily seen that the term $k_b$ may be easily implemented from $k_d$ with a DC offset as a correction. The coefficient terms of equations 6 and 7 may be produced based on the drain current. FIG. 4 depicts an example comparison of the body voltage drive 400 produced by the circuit 100 to an ideal body voltage target 405 to maximize performance of the FET 103. As shown in FIG. 4, the example body voltage drive 400 produced by the circuit 100 is very close to the example ideal body voltage target 405.

Returning to FIG. 1, the circuit 100 may work by changing the body voltage of FET 103 as a function of output power that correlates to the drain current of the FET 103. The circuit 100 may modulate the body terminal 109, matching the correction third order polynomial as previously described. The voltage source 151 may control the static term $k_b$, described with respect to equation 6. Resistor 154 may be a relatively high value resistor, which may isolate the voltage source 151 such that RF from circuit 100, or more particularly drain terminal 106, is limited from entering voltage source 151. The RF from circuit 100, or more particularly drain terminal 106, entering voltage source 151 may be undesirable because it may result in waste of power and/or may prevent correct operation of FET 127. Specifically, the voltage source 151 may affect the corrective current, $I_c$, flowing through FET 127. The static term $k_b$ may be equal to $I_c$ multiplied by the resistance of resistor 148.

In some embodiments, FET 127 may be scaled to be smaller than FET 103. For example, FET 127 may be at least an order of magnitude smaller than FET 103 so as to not consume as much power or area as FET 103.

Figure 5:
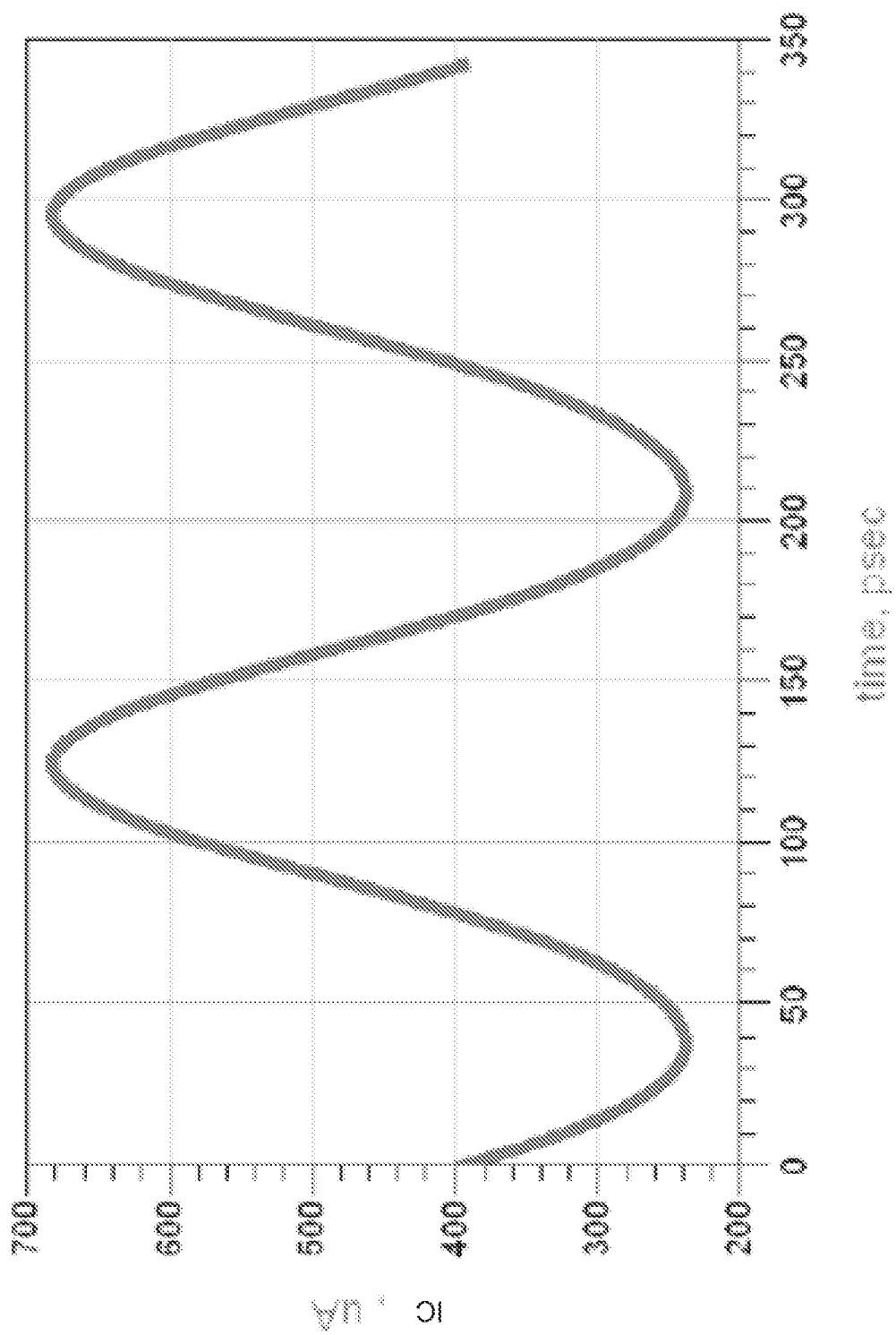
FIG. 5 illustrates an example of corrective current when radio frequency (RF) output power is low, in accordance with various embodiments.

In embodiments, the capacitor 157 may serve to couple RF energy to the gate of FET 127 to aid the third order polynomial fit that is a function of power. Specifically, capacitor 157 may serve to match the inflection point in the third order polynomial. In some embodiments, as described above, capacitor 157 may be omitted from circuit 100. In some embodiments, resistor 139 may limit current entering the body terminal 109 of FET 103, and in some embodiments may be omitted without affecting the example third order polynomial fit described above. In embodiments, resistor 148 may serve as a negative feedback mechanism to ensure the current of FET 127 self-limits; hence the voltage applied to the body terminal 109 similarly self-limits. When the circuit 100 is operating at low output power levels, the FET 127 may operate in a Class A-like fashion, and its output current may have little to no DC content as shown in FIG. 5.

Figure 6:
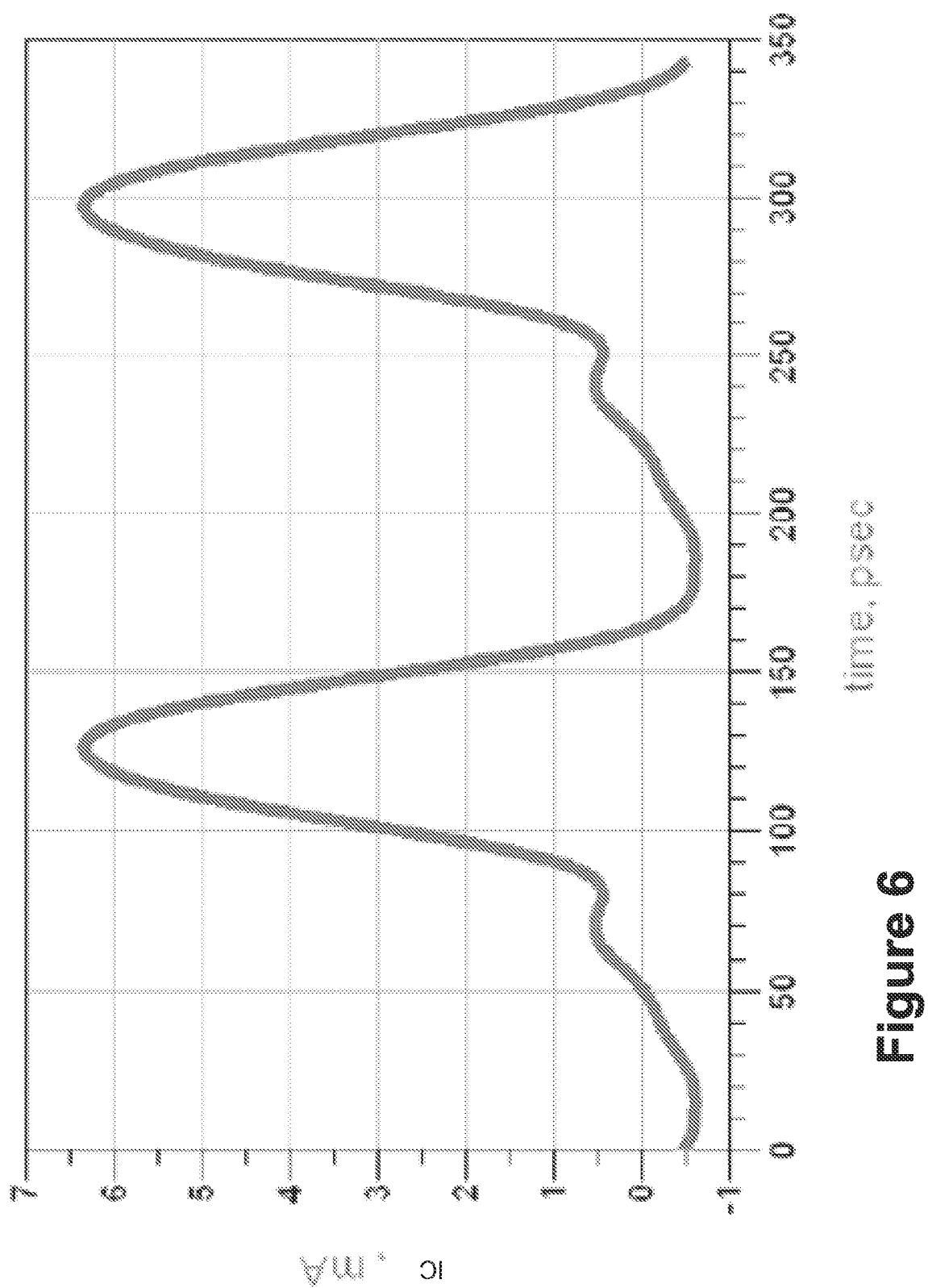
FIG. 6 illustrates an example of corrective current when RF output power is high, in accordance with various embodiments.

However, as output power increases, FET 127 may not be able to conduct current when FET 103 is strongly conducting current, and will produce an asymmetrical current pulse correlating to the current of FET 103. As the waveform is asymmetrical, it may have at least some DC content, and may be used to drive the body of FET 103. FIG. 5 depicts an example waveform of the current of FET 127 when output power of the circuit 100 is low. As can be seen in FIG. 5, the example waveform may be symmetrical or approximately symmetrical. By contrast, FIG. 6 depicts an example waveform of the current of FET 127 when the output power of the circuit 100 is high. As can be seen, the example waveform depicted in FIG. 6 may be asymmetrical, and may include a DC component.

Capacitor 145 may be used to filter the voltage generated to drive the body of FET 103, but in some embodiments capacitor 145 may be omitted because an internal body to source capacitance may exist in FET 103. Furthermore, in some embodiments, omitting capacitor 145 and allowing body voltage variation of the circuit 100 during an RF cycle may not be detrimental, and may be used as a design tool to change dynamic characteristics of the FET 103.

Figure 7:
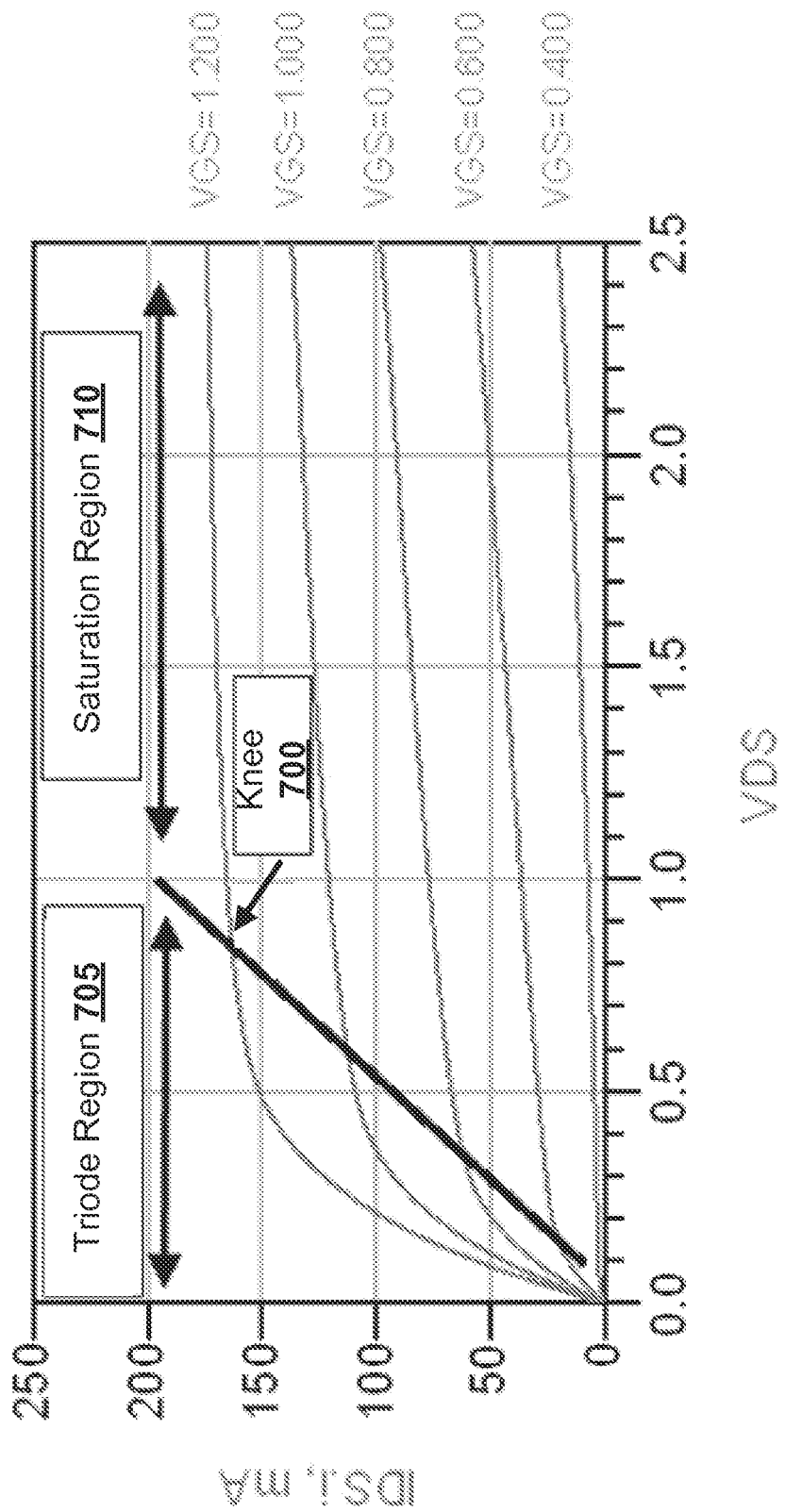
FIG. 7 illustrates an example of a saturation region for a FET with a Body-Source voltage ($V_{Bs}$) of approximately 0 Volts (V), in accordance with various embodiments.
Figure 8:
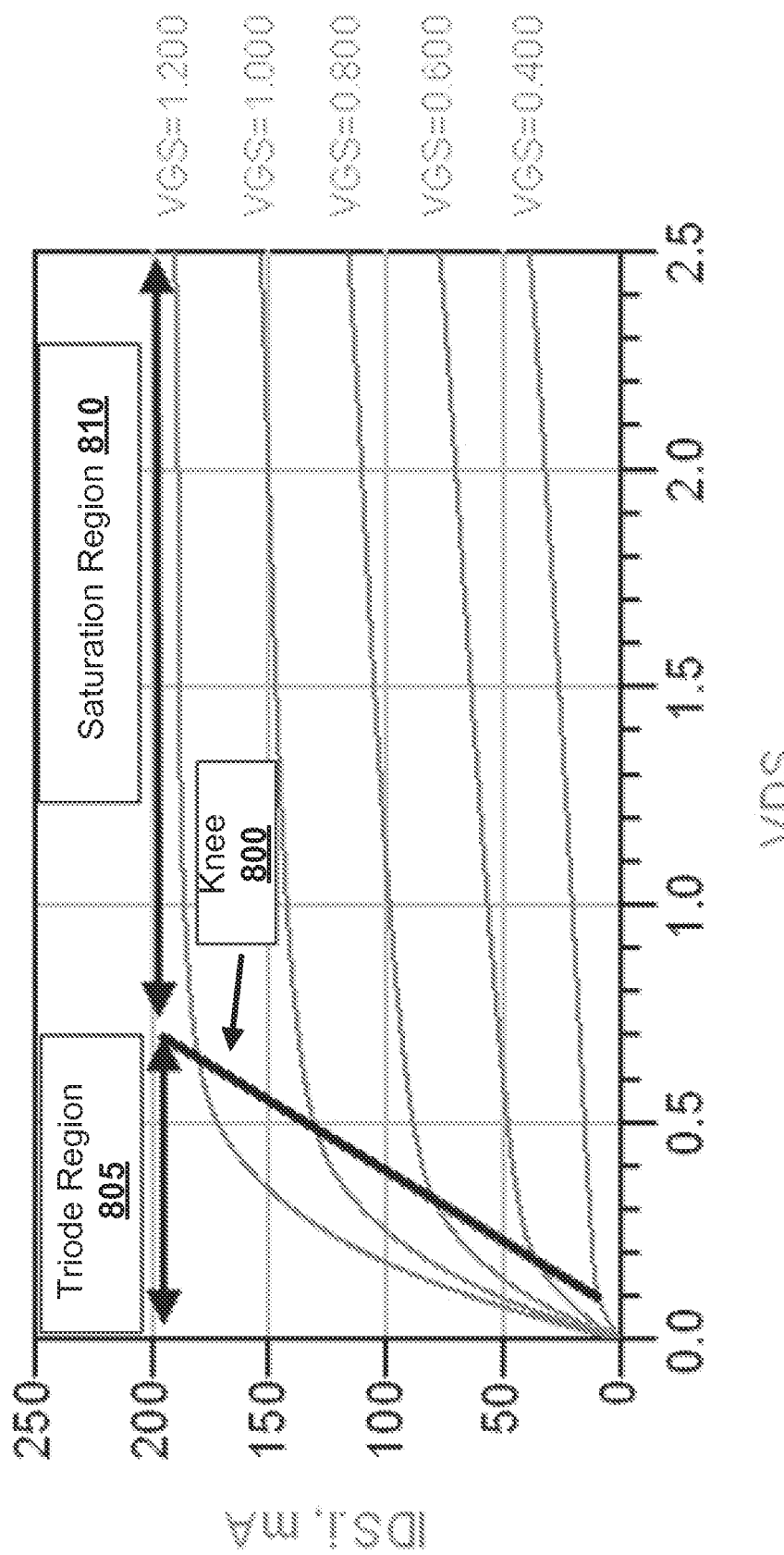
FIG. 8 illustrates an example of a saturation region for a FET with a $V_{BS}$ of approximately 0.5 V, in accordance with various embodiments.

FIG. 7 depicts an example graph of voltage versus current for FET 103 with a VBS of 0 Volts. By contrast, FIG. 8 depicts an example graph of voltage versus current for FET 103 with a $V_{BS}$ of 0.5 Volts. As can be seen, as $V_{BS}$ increases, the knee voltage (indicated by the solid line 700 and 800, respectively) may decrease and/or move to the left. Generally, the saturation regions 710/810 of the FET 103 may be the portion of the graph to the right of the knee voltages 700 and 800, and the triode regions 705/805 of the FET 103 may be the portion of the graph to the left of the knee voltages 700 and 800. Generally, as the current at a given $V_{GS}$ increases, the size of the saturation regions 710/810 may increase. Specifically, as can be seen in FIGS. 7 and 8, as a result of the decrease in the knee voltage 700/800, the triode region 705 depicted in FIG. 7 may be decreased as shown in the triode region 805 in FIG. 8. By contrast, the saturation region 710 may expand as shown by saturation region 810 in FIG. 8.

Generally, the efficiency and output power of a FET such as FET 103 may be limited by the presence of the knee voltage. With a smaller knee voltage, the FET may handle a larger voltage swing and peak current than a FET with a larger knee voltage. The knee voltage of the FET may be reduced when the power load is increased, thus enabling extended power and improved efficiency in our claim.

In mathematical form, the efficiency reduction factor due to knee voltage may be considered to be approximately equal to $1/(1+V_K/V_{DS})$ where $V_{DS}$ indicates the DC voltage from the drain to the source of the FET and $V_K$ is the knee voltage. It can be seen from the above equation that with no knee voltage ($V_K=0$), the efficiency of the FET may be only minimally impacted, or not impacted at all. Furthermore, it can be seen that at low supply voltages ($V_{DS}$), the knee voltage may have a larger impact on efficiency. In case of SOI CMOS FETs, $V_{DS}$ may be kept low due to breakdown issues related to the FETs, and the knee voltage may have a significant impact.

Figure 9:
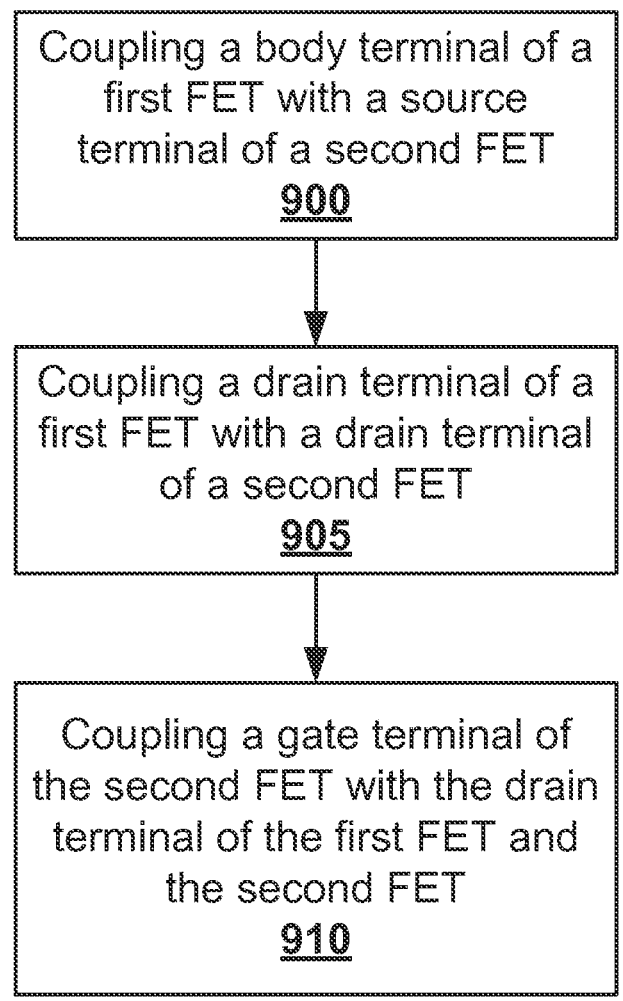
FIG. 9 illustrates an example process of generating a circuit, in accordance with various embodiments.

FIG. 9 depicts a simplistic process for generating a circuit such as circuit 100. Specifically, the process may include coupling a body terminal of a first FET, for example, body terminal 109 of FET 103, with a source terminal of a second FET, for example, source terminal 130 of FET 127, at 900. The process may further include coupling a drain terminal of the first FET, for example, drain terminal 106 of FET 103, with a drain terminal of a second FET, for example, drain terminal 133 of FET 127. The process may further include coupling a gate terminal of the second FET, for example, gate terminal 136 of FET 127, with the drain terminal of the first FET, for example, drain terminal 106 of FET 103, and the drain terminal of the second FET, for example, drain terminal 133 of FET 127.

Figure 10:
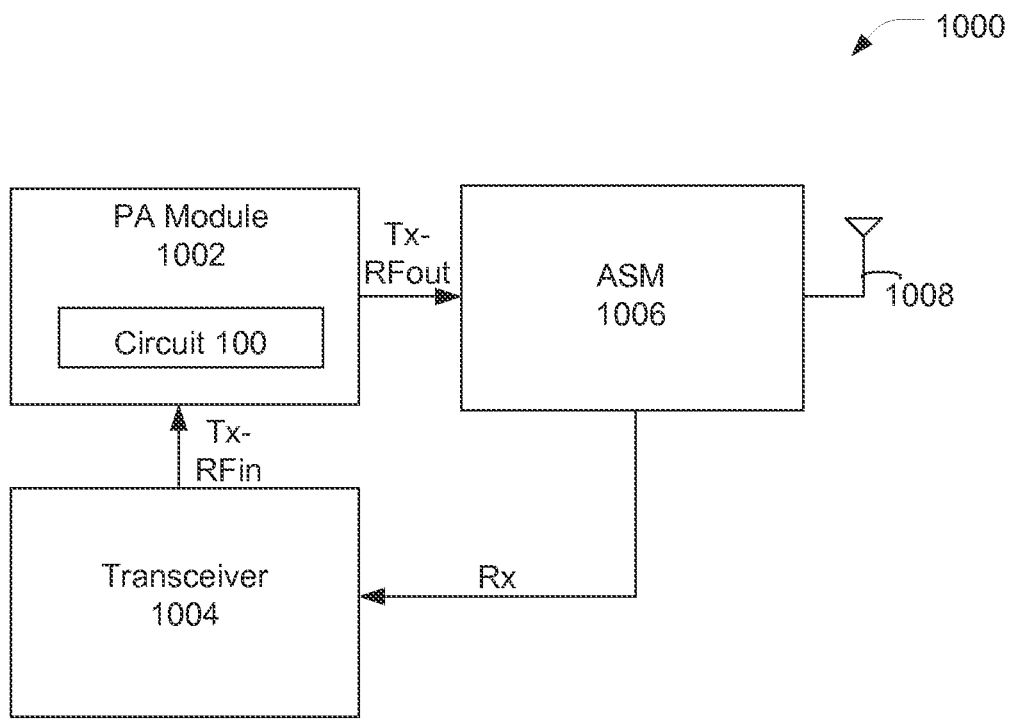
FIG. 10 is a block diagram of an exemplary wireless communication device, in accordance with various embodiments.

The circuit 100 may be incorporated into a variety of systems. A block diagram of an example system 1000 is illustrated in FIG. 10. As illustrated, the system 1000 includes a power amplifier (PA) module 1002, which may be a radio frequency (RF) PA module in some embodiments. The system 1000 may include a transceiver 1004 coupled with the PA module 1002 as illustrated. The PA module 1002 may include the circuit 100 to perform any of a variety of operations such as amplification, switching, mixing, etc. In various embodiments, the circuit 100 may additionally/alternatively be included in the transceiver 1004 to provide, e.g., up-converting, or in an antenna switch module (ASM) 1006 to provide various switching functions.

The PA module 1002 may receive an RF input signal, RFin, from the transceiver 1004. The PA module 1002 may amplify the RF input signal, RFin, to provide the RF output signal, RFout. The RF input signal, RFin, and the RF output signal, RFout, may both be part of a transmit chain, respectively noted by Tx-RFin and Tx-RFout in FIG. 10.

The amplified RF output signal, RFout, may be provided to the ASM 1006, which effectuates an over-the-air (OTA) transmission of the RF output signal, RFout, via an antenna structure 1008. The ASM 1006 may also receive RF signals via the antenna structure 1008 and couple the received RF signals, Rx, to the transceiver 1004 along a receive chain.

In various embodiments, the antenna structure 1008 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

The system 1000 may be suitable for any one or more of terrestrial and satellite communications, radar systems, and possibly in various industrial and medical applications. More specifically, in various embodiments, the system 1000 may be a selected one of a radar device, a satellite communication device, a mobile computing device (e.g., a phone, a tablet, a laptop, etc.), a base station, a broadcast radio, or a television amplifier system.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. A circuit comprising:
a first field effect transistor (FET) with a first drain terminal, a first gate terminal, a first source terminal, and a first body terminal, wherein the first drain terminal is electrically coupled with a third FET that is in series with the first FET;
a second FET with a second drain terminal, a second gate terminal, and a second source terminal, wherein the second drain terminal is electrically coupled with the first drain terminal and the third FET, the second source terminal is electrically coupled with the first body terminal, and the second gate terminal is electrically coupled with the first drain terminal, the second drain terminal, and the third FET;
a first resistor electrically coupled with the second gate terminal, the third FET, the first drain terminal, the second drain terminal, and a voltage source, wherein the first resistor is electrically coupled between the voltage source and the second gate terminal, the third FET, the first drain terminal, and the second drain terminal;
a second resistor electrically coupled with the first body terminal, the second source terminal, and a ground, wherein the second resistor is electrically coupled between the ground and the second source terminal, and the second resistor is further electrically coupled between the ground and the first body terminal; and
a capacitor electrically coupled between the second gate terminal and the second drain terminal, the second gate terminal and the first drain terminal, and the second gate terminal and the third FET.

2. The circuit of claim 1, wherein the first FET or the second FET are a silicon on insulator (SOI) complimentary metal-oxide-semiconductor (CMOS) FET.

3. The circuit of claim 1, wherein a source terminal of the third FET is electrically coupled with a body terminal of the third FET, and wherein the source terminal of the third FET is coupled with the first drain terminal, the second drain terminal, the capacitor, the first resistor, and the gate terminal.

4. A circuit comprising:
a first field effect transistor (FET) with a first drain terminal, a first gate terminal, a first source terminal, and a first body terminal; and
a second FET with a second drain terminal, a second gate terminal coupled to a voltage source, and a second source terminal;
wherein the first body terminal is electrically coupled with the second source terminal; and
the first drain terminal is electrically coupled with the second drain terminal; and
a resistor coupled between the second gate terminal and the voltage source.

5. The circuit of claim 4, wherein the first FET or the second FET are a complementary metal-oxide-semiconductor (CMOS) FET.

6. The circuit of claim 5, wherein the first FET or the second FET are a silicon on insulator (SOI) CMOS FET.

7. The circuit of claim 4, further comprising a resistor electrically coupled with the first body terminal and the second source terminal.

8. The circuit of claim 4, wherein the second gate terminal, the first drain terminal, and the second drain terminal are electrically coupled with a third FET, and further comprising a capacitor coupled between the second gate terminal and the third FET.

9. The circuit of claim 8, wherein a source terminal of the third FET is electrically coupled with a body terminal of the third FET.

10. The circuit of claim 9, wherein the first drain terminal is coupled with the source terminal of the third FET.

11. The circuit of claim 4, further comprising an input matching network coupled with the first gate terminal.

12. The circuit of claim 4, wherein the second FET is smaller than the first FET.

13. A circuit comprising:
a first field effect transistor (FET);
a second FET electrically coupled with the first FET, such that a source terminal of the second FET is directly electrically coupled with a body terminal of the first FET, wherein the second FET is to alter a voltage between the body terminal and a source terminal of the first FET based on a current flowing through the first FET; and
a voltage source coupled with the first FET and the second FET, the voltage source to alter a static component related to a voltage at the body terminal of the first FET.

14. The circuit of claim 13, wherein the first FET or the second FET are a complementary metal-oxide-semiconductor (CMOS) FET.

15. The circuit of claim 14, wherein the first FET or the second FET are a silicon-on-insulator (SOI) CMOS FET.

16. The circuit of claim 13, wherein a drain terminal of the second FET is directly electrically coupled with the drain terminal of the first FET.

17. The circuit of claim 13, further comprising a resistor electrically coupled between the voltage source and the first and second FETs, to reduce an amount of a radio frequency (RF) signal at the voltage source.

18. The circuit of claim 13, further comprising a capacitor electrically coupled between a gate terminal of the second FET and the drain terminal of the first FET, the capacitor to direct a polynomial curve related to the voltage between a body terminal and a source terminal of the first FET.

\* \* \* \* \*

UNITED STATES PATENT AND TRADEMARK OFFICE
CERTIFICATE OF CORRECTION

PATENT NO. : 9,584,069 B1  
APPLICATION NO. : 14/641224  
DATED : February 28, 2017  
INVENTOR(S) : Mehra Mokalla Page 1 of 1

It is certified that error appears in the above-identified patent and that said Letters Patent is hereby corrected as shown below:

In the Specification

In Column 1, Line 53, replace "voltage ($V_{Bs}$)" with --voltage ($V_{BS}$)--.

In Column 4, Line 3, replace "$V_{AS}$ may" with --$V_{GS}$ may--.

In Column 4, Line 4, replace "$V_{TO}$ may" with --$V_{T0}$ may--.

Signed and Sealed this  
Fourth Day of July, 2017

Joseph Matal  
*Performing the Functions and Duties of the*  
*Under Secretary of Commerce for Intellectual Property and*  
*Director of the United States Patent and Trademark Office*